(12) United States Patent
Chan et al.

(10) Patent No.: US 9,490,007 B1
(45) Date of Patent: Nov. 8, 2016

(54) DEVICE COMPRISING A PLURALITY OF FDSOI STATIC RANDOM-ACCESS MEMORY BITCELLS AND METHOD OF OPERATION THEREOF

(71) Applicant: GLOBALFOUNDRIES Inc., Grand Cayman (KY)

(72) Inventors: Nigel Chan, Dresden (DE); Germain Bossu, Dresden (DE); Michael Otto, Weinboehla (DE)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 14/718,574

(22) Filed: May 21, 2015

(51) Int. Cl.
G11C 11/00 (2006.01)
G11C 11/419 (2006.01)

(52) U.S. Cl.
CPC .................................. *G11C 11/419* (2013.01)

(58) Field of Classification Search
CPC ............. G11C 11/412; G11C 11/4125; H01L 27/1104
USPC ........................ 365/154, 156, 230.05, 189.02
See application file for complete search history.

(56) References Cited

U.S. PATENT DOCUMENTS

| | | | |
|---|---|---|---|
| 7,710,765 B2* | 5/2010 | Hanafi ................... | G11C 11/412 365/156 |
| 8,144,501 B2 | 3/2012 | Chen et al. | |
| 8,295,099 B1* | 10/2012 | Yachareni ................. | G11C 8/16 365/189.04 |
| 9,111,638 B2* | 8/2015 | Burnett ................. | G11C 11/419 |
| 2006/0274569 A1 | 12/2006 | Joshi et al. | |
| 2009/0098694 A1* | 4/2009 | Ekbote ................... | G11C 11/412 438/200 |
| 2010/0188889 A1 | 7/2010 | Hanafi | |
| 2013/0175627 A1* | 7/2013 | Goldbach ........... | H01L 27/1104 257/350 |

OTHER PUBLICATIONS

Grenouillet et al., "UTBB FDSOI transistors with dual STI for a multi-Vt strategy at 20nm node and below," IEEE, IEDM12:64-67, 2012.
Kim et al., "Stable High-Density FD/SOI SRAM with Selective Back-Gate Bias Using Dual Buried Oxide," 2008 IEEE International SOI Conference Proceedings, pp. 37-38, 2008.

* cited by examiner

Primary Examiner — Son Dinh
(74) Attorney, Agent, or Firm — Amerson Law Firm, PLLC

(57) ABSTRACT

A device including a plurality of static random-access memory (SRAM) bitcells arranged in rows and columns, wherein the SRAM bitcells comprise fully depleted silicon-on-insulator field effect transistors (FDSOI-FETs). The FDSOI-FETs comprise P-channel-pull-up-transistors, wherein each P-channel-pull-up-transistor comprises a back gate. The device further includes a plurality of bitlines, wherein each bitline is electrically connected to the SRAM bitcells of one of the columns and a plurality of wordlines, wherein each wordline is electrically connected to the SRAM bitcells of one of the rows. The device further includes a bitline control circuit configured to select at least one column for writing, wherein during a write operation a first control signal is applied to the back gates of the P-channel-pull-up-transistors of the at least one column selected for writing and a second control signal to the back gates of the P-channel-pull-up-transistors of the columns not selected for writing.

21 Claims, 7 Drawing Sheets

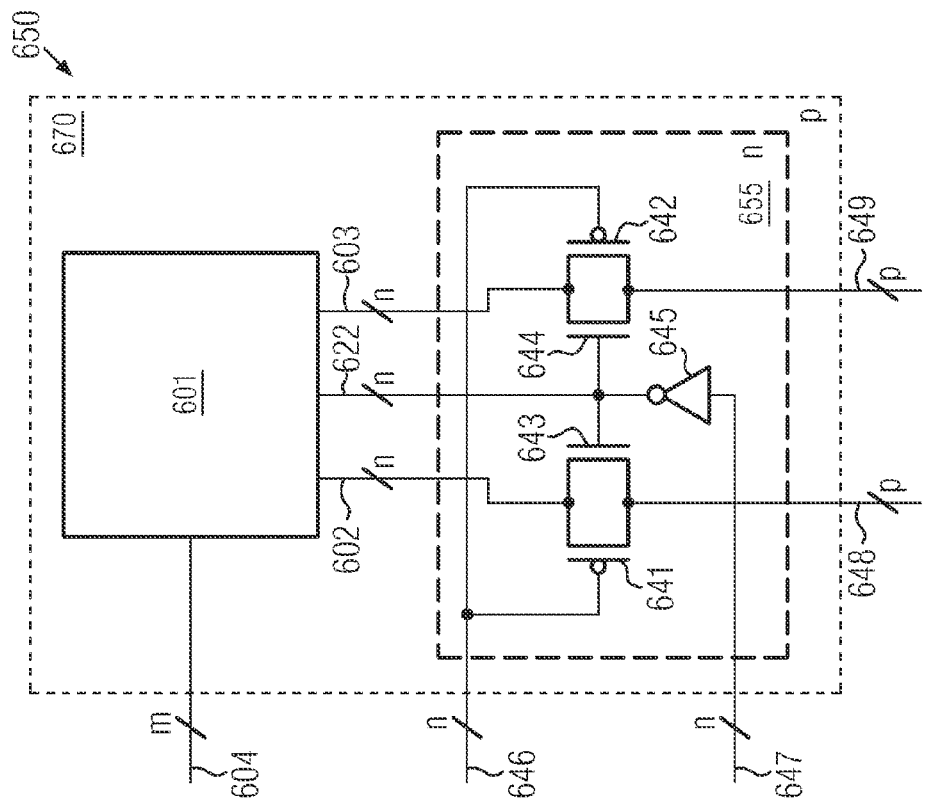
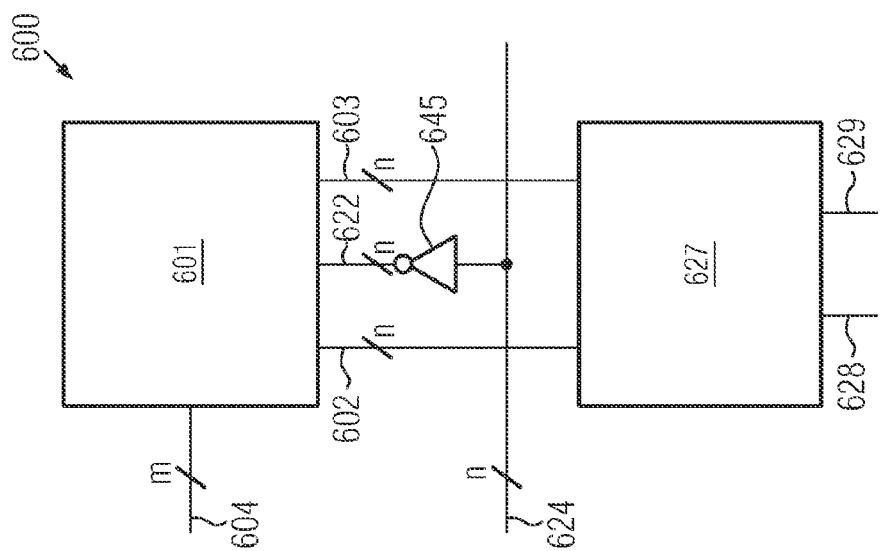
FIG. 6b
FIG. 6a

DEVICE COMPRISING A PLURALITY OF FDSOI STATIC RANDOM-ACCESS MEMORY BITCELLS AND METHOD OF OPERATION THEREOF

BACKGROUND OF THE INVENTION

1. Field of the Invention

Generally, the present disclosure relates to the field of integrated circuits, and, more particularly, to integrated circuits comprising static random-access memory devices.

2. Description of the Related Art

Types of semiconductor memory include dynamic random-access memory (DRAM) and static random-access memory (SRAM). DRAM devices comprise memory cells having a relatively simple structure, in particular memory cells wherein an amount of charge stored in a capacitor is used to represent a bit of information. Due to the simple structure of DRAM cells, a high density of integration can be obtained. However, due to leakage currents in the capacitors, DRAM devices typically require refresh cycles to avoid a loss of stored information.

In SRAM devices, cross-coupled inverters are used for storing information. In SRAM devices, refresh cycles need not be performed, and they typically allow a greater speed of operation than DRAM devices. However, SRAM devices comprise memory cells which typically have a more complex structure than the memory cells of DRAM devices, which may limit the density of integration that can be obtained in SRAM devices.

An SRAM device 100 will be described with reference to FIG. 1. The SRAM device 100 comprises an SRAM bitcell 101, a bitline 102 and an inverse bitline 103 connected to a bitline control circuit 127, a wordline 104 connected to a wordline control circuit 128 and a high voltage power supply line 105 and a low voltage power supply line 106 connected to a power supply control circuit 130.

In operation of the device 100, the high voltage power supply line 105 can be maintained at a higher voltage than the low voltage power supply line 106. Accordingly, the voltage of the high voltage power supply line 105 will be denoted as "high voltage" and the voltage of the low voltage power supply line 106 will be denoted as "low voltage," although the high voltage is typically on an order of magnitude of a few volts.

The SRAM cell 101 comprises a first inverter 107 having an input 113 and an output 111, and a second inverter 108 having an input 114 and an output 112. The output 111 of the first inverter 107 is electrically connected to the input 114 of the second inverter 108, and the output 112 of the second inverter 108 is electrically connected to the input 113 of the first inverter 107.

Each of the inverters 107, 108 comprises a pull-up transistor, wherein the pull-up transistor of the first inverter 107 is denoted by reference numeral 115, and the pull-up transistor of the second inverter 108 is denoted by reference numeral 116. Moreover, each of the inverters 107, 108 comprises a pull-down transistor, wherein reference numeral 117 denotes the pull-down transistor of the first inverter 107, and reference numeral 118 denotes the pull-down transistor of the second inverter 108.

The pull-up transistors 115, 116 may be P-channel transistors, which may be switched from an on state, wherein the transistors have a relatively high conductivity, to an off state by applying the high voltage to their gate electrodes so that there is only a relatively low source drain leakage conductivity. The pull-down transistors 117, 118 may be N-channel transistors which may be switched from an off state, wherein there is only a relatively low leakage conductivity, to an on state by applying the high voltage to their gate electrodes so that they have a relatively high conductivity.

The SRAM cell 101 further comprises pass-gate transistors 109, 110. The pass-gate transistor 109 is electrically connected between the inverse bitline 103 and the output 111 of the first inverter, and the second pass-gate transistor 110 is electrically connected between the bitline 102 and the output 112 of the second inverter 108. Gate electrodes of the pass-gate transistors 109, 110 are electrically connected to the wordline 104. The pass-gate transistors 109, 110 may be N-channel transistors which may be switched from an off state to an on state by applying the high voltage to their gate electrodes. Accordingly, if the high voltage is applied to the wordline 104, an electrical connection is established between the inverse bitline 103 and the output 111 of the first inverter 107, and between the bitline 102 and the output 112 of the second inverter 108.

The device 100 may comprise a plurality of SRAM cells having a structure corresponding to the structure of SRAM cell 101, and may also comprise a plurality of wordlines similar to wordline 104, and a plurality of bitlines and inverse bitlines similar to bitline 102 and inverse bitline 103. Typically, there is an array of SRAM cells having rows and columns of SRAM cells, wherein the wordlines extend along the rows of the array, and the bitlines and inverse bitlines extend along the columns of the array. Individual SRAM cells of the device 100 can be addressed by applying the high voltage to the wordline to which the SRAM cell is connected to switch the pass-gate transistors of the respective cell into the on state and by applying and/or reading voltages from the bitline and the inverse bitline to which the SRAM cell is connected. The other wordlines can be maintained at the low voltage. Bitlines and inverse bitlines are typically kept at the high voltage during standby mode and are left electrically floating during reading.

The SRAM cell 101 can have three modes of operation. In a standby mode, the voltage of wordline 104 is low, so that pass-gate transistors 109, 110 are in the off state and the inverters 107, 108 are electrically disconnected from bitline 102 and inverse bitline 103. Since the output 111 of the first inverter 107 is electrically connected to the input 114 of the second inverter 108, and the output 112 of the second inverter 108 is electrically connected to the input 113 of the first inverter 107, the inverters 107, 108 can reinforce each other, so that they substantially maintain their respective state. Accordingly, there is a first state of the SRAM cell 101, wherein the output 111 of the first inverter 107 is substantially at the low voltage and the output 112 of the second inverter 108 is substantially at a the high voltage, and a second state, wherein the output 111 of the first inverter 107 is substantially at the high voltage, and the output 112 of the second inverter 108 is substantially at the low voltage. These two states can be used to store one bit of information.

For reading the bit of information stored in the SRAM cell 101, the bitline 102 and the inverse bitline 103 can be pre-charged to the high voltage. Then, the bitline 102 and the inverse bitline 103 are left electrically floating and the wordline 104 is switched from low voltage to high voltage, so that the pass-gate transistors 109, 110 establish an electrical connection between the bitline 102 and the output 112 of the second inverter 108, and an electrical connection between the inverse bitline 103 and the output 111 of the first inverter 107. Depending on the state of the SRAM cell 101, a voltage difference between the bitline 102 and the inverse bitline 103 is created, which can be sensed by a sense amplifier 129 arranged in the bitline control circuit 127 to determine the state of SRAM cell 101.

For writing data to the SRAM cell 101, the high voltage can be applied to one of the bitline 102 and the inverse bitline 103, and the low voltage can be applied to the other one of the bitline 102 and the inverse bitline 103, depending on the state of the SRAM cell 101 to be obtained after the write operation. The corresponding data signals may be applied by a write driver circuit 125 arranged in the bitline control circuit 127. Thereafter, the voltage of the wordline 104 can be switched by the wordline control circuit 127 from low to high to switch the pass-gate transistors 109, 110 into the on state. Thereby, the voltages applied to the bitline 102 and the inverse bitline 103 are applied to the inputs 113, 114 of the inverters 107, 108. If the initial state of SRAM cell 101 is different from the state to be written to SRAM cell 101, this typically causes the inverters 107, 108 to change their state.

An issue in writing data to SRAM cells can be avoiding a write failure, wherein the SRAM cells do not change its state, although the state to be written to the SRAM cells is different from the initial state. This is of particular concern for nano-scale device technologies due to a general instability of smaller SRAM cells due to an increased variation of the threshold voltages of the transistors, which is in particular caused by short channel effects and random dopant fluctuations. Writeability of SRAM cells is further affected by the reduction of the voltage of the high voltage power supply which is a further consequence of device scaling. The reduction of supply voltage reduces concurrently a write margin and a read static noise margin characterizing the ability to write and read of the SRAM cells. Consequently, a plurality of techniques has been established to improve writeability of SRAM cells.

The likelihood of a write failure occurring can be related to a ratio between a conductivity of pass-gate transistors in the on state, and a conductivity of pull-up transistors in the on state, which is denoted as "gamma ratio." In general, a greater gamma ratio can reduce the likelihood of a write failure occurring. Accordingly, for avoiding write failures, it is advantageous if the conductivities of the pass-gate transistors in the on state (and, accordingly, a width of the channel regions of these transistors) are relatively large compared to the conductivities of the pull-up transistors 115, 116 in the on state (and, accordingly, a width of the channel regions of these transistors).

The stability of the SRAM cells with respect to a read disturbance can be dependent on the so-called "beta ratio" representing a ratio between the conductivity of pull-down transistors in the on state and the conductivity of pass-gate transistors in the on state. A greater beta ratio can be helpful for increasing the stability of SRAM cells with respect to read disturbances. Thus, it is of advantage when a width of the channel regions of the pass-gate transistors is relatively low compared to a width of the channel regions of the pull-down transistors.

Hence, there is a trade-off between the stability of SRAM cells with respect to read disturbances, and writeability of the SRAM cells, which is related to the occurrence of write failures. A greater conductivity of the pass-gate transistors in the on state may be helpful for reducing the likelihood of write failures occurring but, at the same time, may increase the likelihood of read disturbances.

For avoiding these issues, it has been proposed to modify the design of SRAM cells by separating the write and read path by including an additional port. However, such solutions typically require two additional transistors i.e., eight transistors per SRAM cell (8T-SRAM), and also require an additional read wordline per row of the device, as well as an additional read bitline per column of the device. This can substantially increase the area of the device that is required for storing one bit of information.

Thus, alternative techniques based on six-transistor-SRAM cells have been proposed to assist the write operation. These techniques are typically based on modifications of the operation signals and operation voltages during the write process. The strength of the pull-up transistors may be optimized for the read operation, whereas the resulting deteriorated write characteristics may be compensated by write assist techniques. Known write assist techniques use, for example, wordline boost, negative bitline or power supply voltage reduction schemes.

In wordline boost schemes, a voltage higher than the power supply voltage is applied to the wordlines which assist the bit cell to flip during a write operation. The boost increases the gate source voltage of the pass-gate transistor and hence increases its drive strength. The increased drive strength of the pass-gate transistor supports significantly a transition of the bitcell. The boost voltage can be routed as a separate power supply or it can be generated internally by a charge bump technique or by capacitive coupling. The benefits of this write assist scheme increases significantly as the supply voltage is scaled down.

In negative bitline schemes, a negative voltage is applied to the source of the pass-gate transistor to increase also the gate source voltage of the pass-gate transistor and to increase its drive strength. The approach of negative bitline based write assist swings the bitline voltage below zero during the write operation. Similar to the wordline boosting, the negative bitline voltage can be generated internally by a charge bump technique or by using a capacitive coupling technique.

Power supply voltage reduction schemes may be established with an enable function that allows reducing a high voltage provided by a power supply to SRAM cells during a write operation. In this case, the data writing circuit may easier overpower pull-up transistors of the SRAM cells. Thus, during the write operation, the influence of device targeting on the writeability of the SRAM cell can be eliminated or at least reduced. Disadvantageously, data corruption may occur in SRAM cells connected to unselected wordlines during the write operation. During a read operation, wherein data are read from the device, the power supply can remain at the high supply voltage.

The write assist techniques wordline boost, negative bitline or power supply voltage reduction schemes may also be combined to improve writeability of the SRAM cells. This adversely affects, however, the control signal timing as a timing critical behavior is in general a disadvantage of known write assist techniques.

A different approach to improve writeability of the SRAM cells may be based on the back gate biasing capability of fin field effect transistors (FinFETs). FinFETs have in general the potential to allow for further device scaling due to the particular characteristics of transistors formed on the basis of thin fins. FinFETs comprise well-defined channel regions and gate electrodes that may control the channel efficiently from different sides of the fin. FinFETs may be manufactured with separated front- and backgates which allows, for example, a threshold voltage tuning of the transistors by backgate biasing, i.e., by applying an appropriate bias voltage to the backgates. Consequently, backgate biasing may be used to improve writeability of SRAM cells based on FinFET architectures. Back gate biasing techniques based on FinFETs are known from U.S. Patent Publication Nos. 2006/0274569, and 2010/0188889 and U.S. Pat. No. 8,144, 501. Disadvantageously, SRAM devices based on FinFETs require complex manufacturing methods. In particular, multi fin transistors may be required to adapt the "transistor-width"-ratio of pull-up and pass-gate transistors of SRAM cells as described above.

Back gate biasing has been employed also to improve writeability of SRAM cells based on fully depleted silicon on insulator (FDSOI) FET architectures. FDSOI-FET comprise a thin silicon channel layer formed on a buried oxide layer. Thus, the channel of a FDSOI-FET is not directly accessible by a back-gate electrode as the buried oxide layer may impede an access from the backside, i.e., from the substrate side. Reducing the thickness of the buried oxide layer allows, however, improving the accessibility and hence the controllability by a back gate formed in the substrate below the channel region of the FDSOI-FET.

Kim et al., "Stable High-Density FD/SOI SRAM with Selective Back-Gate Bias Using Dual Buried Oxide," 2008 *IEEE International SOI Conference Proceedings*, pp. 37-38, discloses FDSOI SRAM cells comprising FDSOI-PFET pull-up transistors with thin buried oxide and FDSOI-NFET pull-down and pass-gate transistors with thick buried oxide so that the PFET pull-up transistors may be differently biased than the NFETs although a global substrate bias voltage is applied to the FDSOI SRAM device.

Grenouillet, et al., "UTBB FDSOI transistors with dual STI for a multi-$V_t$ strategy at 20 nm node and below," *IEDM* 2012, pp 64-67, discloses FDSOI SRAM cells comprising FDSOI-PFET pull-up transistors and FDSOI-NFET pull-down and pass-gate transistors separated by deep isolation trenches so that a wider backbias voltage range is applicable, which allows for more efficient device tuning.

In view of the situation described above, the present disclosure is related to a method of writing data to an array of SRAM cells and a device comprising a plurality SRAM cells that allows to obtain a relatively high stability with respect to disturbances and a relatively low likelihood of write failures occurring, while substantially avoiding or at least reducing an increase of the area of the device required for storing one bit of information.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative device as disclosed herein includes a plurality of static random-access memory (SRAM) bitcells arranged in rows and columns, wherein the SRAM bitcells comprise fully depleted silicon-on-insulator field effect transistors (FDSOI-FETs). The FDSOI-FETs comprise P-channel-pull-up-transistors, wherein each P-channel-pull-up-transistor comprises a back gate. The device further includes a plurality of bitlines, wherein each bitline is electrically connected to the SRAM bitcells of one of the columns, and a plurality of wordlines, wherein each wordline is electrically connected to the SRAM bitcells of one of the rows. The device further includes a bitline control circuit configured to select at least one column for writing, wherein, during a write operation, a first control signal is applied to the back gates of the P-channel-pull-up-transistors of the at least one column selected for writing and a second control signal to the back gates of the P-channel-pull-up-transistors of the columns not selected for writing.

An illustrative method disclosed herein includes providing a plurality of static random-access memory (SRAM) bitcells arranged in rows and columns, wherein the SRAM bitcells comprise fully depleted silicon-on-insulator field effect transistors (FDSOI-FETs), the FDSOI-FETs comprise P-channel-pull-up-transistors, wherein each P-channel-pull-up-transistor comprises a back gate. The method further includes writing data to at least one of the plurality of SRAM bitcells by applying a wordline signal to a wordline electrically connected to the SRAM bitcells of one row, applying a data signal to at least one bitline electrically connected to the SRAM bitcells of at least one column selected for writing, and applying a first control signal to the back gates of the P-channel-pull-up-transistors of at least one column selected for writing and a second control signal to the back gates of the P-channel-pull-up-transistors of the columns not selected for writing.

BRIEF DESCRIPTION OF THE DRAWINGS

The disclosure may be understood by reference to the following description taken in conjunction with the accompanying drawings, in which like reference numerals identify like elements, and in which:

FIGS. 6a-6b schematically illustrate SRAM devices with back gate control circuits according to further embodiments of the present invention.

Figure 1:
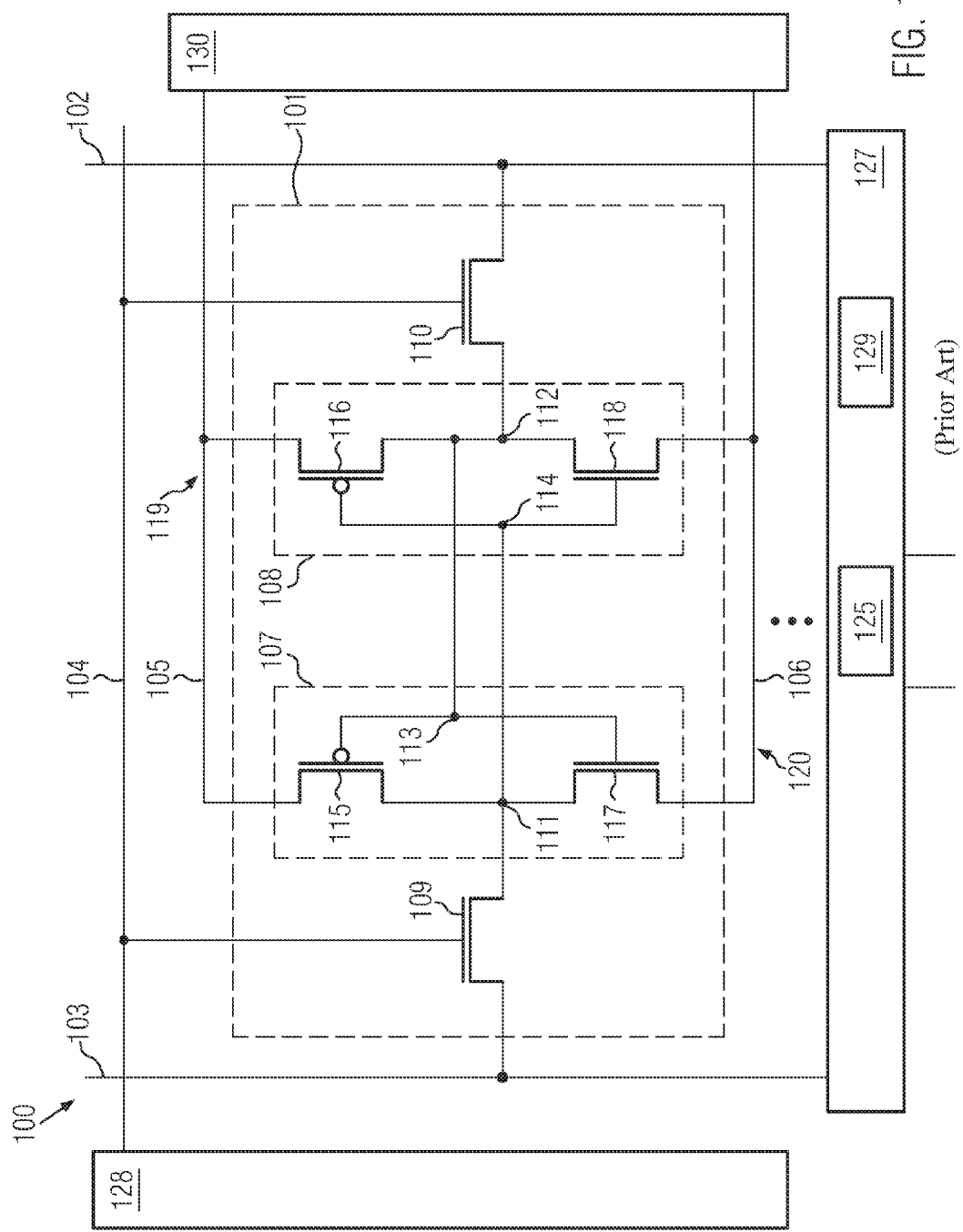
FIG. 1 schematically illustrates an SRAM device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the invention. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Embodiments provide SRAM devices comprising a plurality of SRAM cells and methods for operating the devices. The SRAM cells comprise FDSOI pull-up transistors having a back gate that may be controlled independently from the pull-down transistors and the pass-gate transistors. The SRAM cells of the array are arranged in rows and columns so that a back gate segmentation along the bitlines can be used, i.e., the back gate terminals of the pull-up transistors of the SRAM cells of selected columns can be controlled simultaneously, wherein the back gate terminals of other columns of the SRAM device can be controlled independently therefrom. Thus, for example, for each bit of a word to be written to the SRAM device, a first control signal may be applied to the back gate electrodes of the pull-up transistors of the columns selected for writing, whereas a second control signal may be applied to the non-selected columns of the SRAM device. Thus, the threshold voltage of the selected pull-up transistors and of the unselected pull-up transistors may be adjusted independently so that it may be appropriately adjusted for write and read operating modes. Thus, the unselected cells may be less susceptible to disturbances during write operations so that the operating stability of the SRAM is improved.

In the embodiments, the voltage of the first control signal during writing may be represented by the high supply voltage (VDD) and the voltage of the second control signal may be represented by the low power supply voltage (VSS). Consequently, the threshold voltage of the pull-up transistors of selected rows may be increased during a write operation so that the write process may be stabilized and performed at a lower level of the high supply voltage without losing functionality of the cell. Concurrently, the threshold voltage of the unselected pull-up transistors may be maintained at a low level so that the non-selected SRAM cells exhibit an improved stability with respect to write disturbances.

In some embodiments, a back gate control circuit configured to generate appropriate back gate control signals may be implemented in the bitline control circuit so that the additional effort for implementing the back gate control technique may be minimized.

Figure 2:
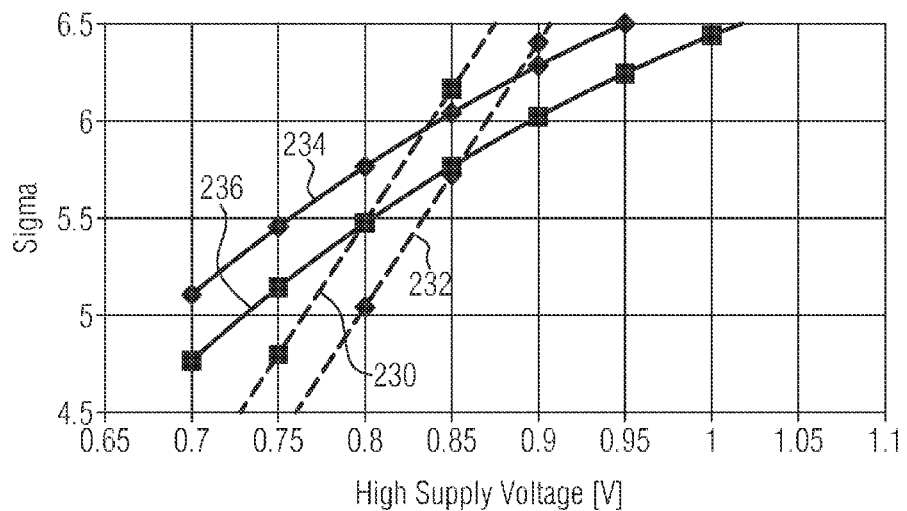
FIG. 2 shows a diagram indicating the allowable number of standard deviations versus the high supply voltage which would invoke a read or write margin fail.

FIG. 2 illustrates the limits of a reduction of a high supply voltage of an FDSOI SRAM cell in dependence of the number of standard deviations (sigma). Sigma represents the number of standard deviations away from the nominal bit which would invoke an access disturb margin (ADM) fail and a write margin (WRM) fail for different threshold voltages $V_t$ of the pull-up transistors. Thus, FIG. 2 may be utilized to optimize the operation conditions of FDSOI SRAM cells with regard to threshold voltage $V_t$ adjustment.

Curve 234 represents an access disturb margin for an SRAM cell, wherein the threshold voltage $V_t$ of the pull-up transistor is not shifted ($\Delta V_t=0$). Curve 236 represents the access disturb margin for the SRAM cell, wherein the threshold voltage $V_t$ of the pull-up transistor is shifted by 0.05 V. Curve 232 represents a write margin of the SRAM cell, wherein the threshold voltage $V_t$ of the pull-up transistors is not shifted, and curve 230 presents a write margin of an SRAM cell, wherein the threshold voltage $V_t$ of the pull-up transistors is shifted by 0.05 V. Thus, FIG. 2 illustrates that, for a given sigma target, the threshold voltage $V_t$ of the pull-up transistor, which is higher during write operation and lower during the read operation, results in a lower high supply voltage required to operate the SRAM cell under conditions that ensure the desired functionality. As can be seen from FIG. 2, an increase of the threshold voltage $V_t$ of the pull-up transistor of the SRAM cell of 0.05 V allows for reducing the high supply voltage by approximately 0.04 V. For example, for a sigma value of 5, the high supply voltage may be reduced from approximately 0.8 V to approximately 0.76 V as indicated by the write margin shift achieved by a threshold voltage shift of the pull-up transistors of 0.05 V as indicated by the curves 232 and 230.

A corresponding threshold voltage shift $\Delta V_t$ of pull-up transistors of SRAM cells, which are typically realized by P-channel transistors, may be achieved by back gate biasing of fully depleted SOI transistors with accordingly configured back gate terminals. Appropriate fully depleted SOI transistors may be manufactured by different approaches based on shallow and/or deep trench isolation structures.

Figure 3A:
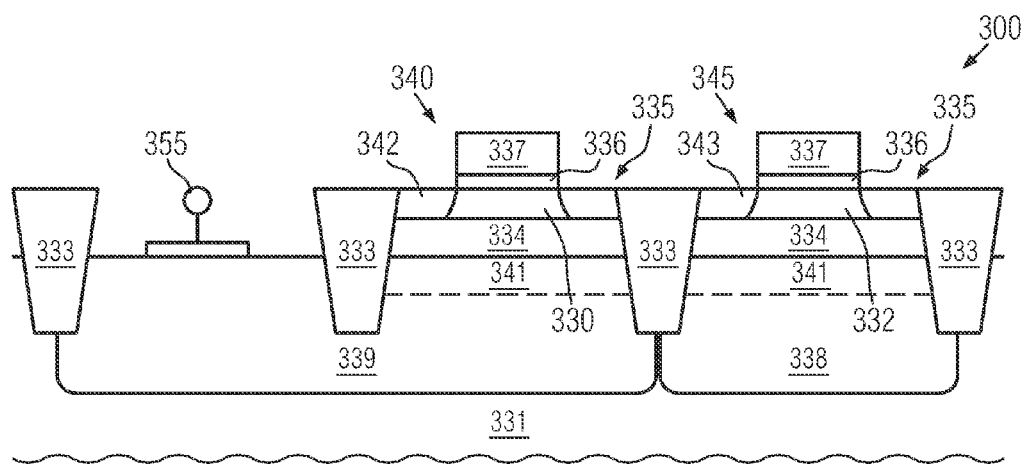
FIGS. 3a-3b schematically illustrate FDSOI transistor architectures allowing for an independent threshold value control of the P-channel transistor.

FIG. 3a depicts a corresponding fully depleted SOI CMOS device 300 comprising a P-channel transistor 340 and an N-channel transistor 345. The P-channel and N-channel transistors 340, 345 are separated by a shallow trench isolation structure 333. The transistors 340, 345 comprise a gate electrode 337 separated from a semiconductor layer 335 by a gate dielectric layer 336. Channel regions 330, 332 of the P-channel and N-channel transistors 340, 345 may be defined in the semiconductor layer 335 by known implantation schemes forming source/drain regions 342, 343 adjacent to the gate electrode 337. The semiconductor layer 335 is separated from a substrate 331 by a buried oxide layer 334. The semiconductor layer 335 typically comprises a thickness of only a few nanometers so that a full depletion of the entire channel regions 330, 332 may be achieved. Typically, the thickness of the semiconductor layer 335 is less than 15 nm. In one embodiment, the thickness of the semiconductor layer 335 is approximately 10 nm or less. The thickness of the buried oxide layer 334 is typically in the range of 10-50 nm and preferably in the range of approximately 20-30 nm. In one embodiment, the thickness of the buried oxide layer 304 is approximately 25 nm so that the channel regions 330 and 332 of the transistors 340 and 345 may be controlled by the front gate electrode 337 and through the buried oxide layer 334 from the back-side, i.e., from an upper region 341 of the substrate 331. To this end, the P-channel transistor 340 comprises a back plane implantation region 339 that is appropriate to preselect a threshold voltage $V_t$ of the P-channel transistor 340. The back plane implantation region 339 of the P-channel transistor 340 typically comprises an N-type implantation species with a concentration of approximately $10^{16}$ to $10^{21}$ atoms per cm$^3$. The concentration of the N-type implantation species may be adjusted to obtain an appropriate preselected threshold voltage $V_t$ of the P-channel transistor 340. The upper region 341 may obtain a further implant species that may be utilized to further tune the threshold voltage $V_t$ of the transistors 340 statically.

The back plane implantation region 339 may comprise a control terminal 355, which is appropriate to apply a control signal to the back plane implantation region 339 so that the threshold voltage $V_t$ of the P-channel transistor 340 may be dynamically tuned by applying an appropriate back bias voltage temporarily.

The back plane implantation region 338 of the N-channel transistor 345 comprises an implantation species forming a P-type back plane implantation, so that the back plane implantation region 339 of the P-channel transistor 340 is separated by a PN junction from the back plane implantation region 338 of the N-channel transistor 345. The concentration of the implantation species in the back plane implantation region 338 is chosen to adjust the threshold voltage of the N-channel transistor 345 appropriately. Alternatively, the upper region 341 may obtain a further implant species that may be utilized to further tune the threshold voltage $V_t$ of the transistor 345.

The back plane implantation regions 339 and 338 extend significantly below the lower limit of the shallow trench isolation regions 333 so that additional P-channel transistors (not shown) may be controlled with a single control terminal 355. The depth of the back plane implantation regions 338, 339 is in the range of approximately 50-500 nm. In one embodiment, the depth of the back plane implantation regions 338, 339 is in the range of approximately 100-300 nm. The depth of the shallow trench isolation regions 333 is in the range of 40-100 nm. In one embodiment, the depth is approximately 70 nm. The shallow trench isolation structures 333 may be formed by known methods used for conventional shallow trench isolation techniques. The back plane implantation regions may be formed by known implantation techniques, wherein appropriate implantation parameters may be obtained from implantation simulation tools.

The fully depleted SOI CMOS device 300 represents a P-channel transistor 340, wherein the threshold voltage $V_t$ of the transistor may be adjusted independently from the N-channel transistor 345. Furthermore, the threshold voltage $V_t$ of the P-channel transistor 340 may be dynamically controlled so that the obtained threshold voltage shift may be performed in a time-controlled manner. Thus, the transistors are appropriate to form SRAM cells that allow for modifying the threshold voltage of the pull-up transistor during a write operation, whereas the threshold voltage $V_t$ of the N-channel transistor may be maintained unmodified. The back bias voltage range that may be applied to the P-channel transistor 340 is limited by the breakdown voltage of the diode formed by the back plane implantation region 339 and the back plane implantation region 338 to less than the breakdown voltage of the diode.

Figure 3B:
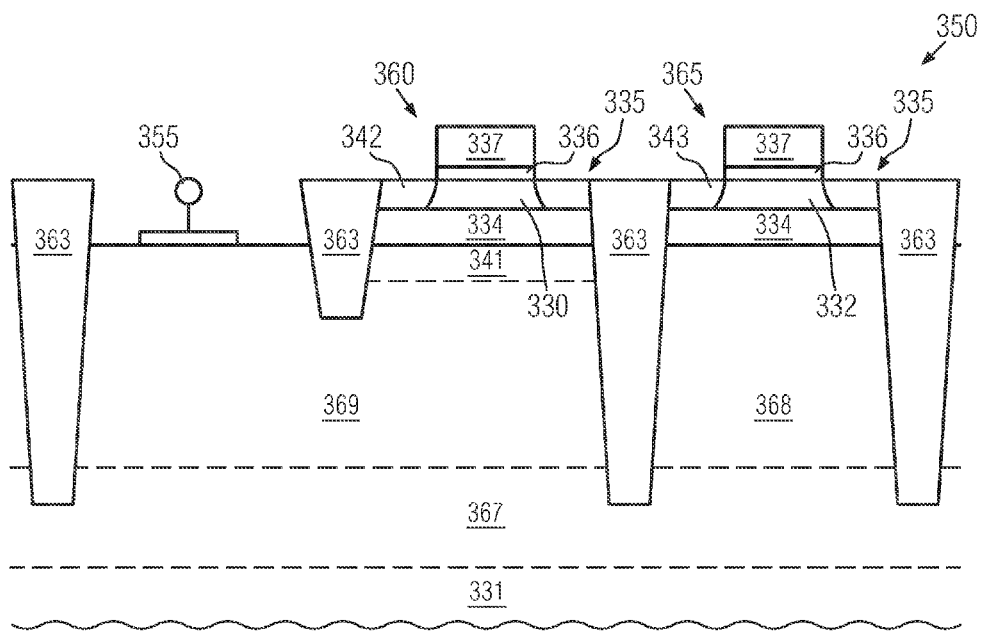

FIG. 3b illustrates a fully depleted SOI CMOS device 350 comprising a P-channel transistor 360 and an N-channel transistor 365. The fully depleted SOI CMOS device 350 allows for utilizing a wider back bias voltage range so that the threshold voltage $V_t$ of the P-channel transistor 360 may be controlled in a significantly wider range. The P-channel transistor 360 and the N-channel transistor 365 are separated by deep isolation structures 363 having a depth in the range of 150-300 nm. In one embodiment, the depth of the deep isolation structures 363 is approximately 200 nm. The P-channel transistor 360, the N-channel transistor 365 and the buried oxide layer 334 are formed above, in and below the semiconductor region 335 as described with regard to the P- and N-channel transistors 340 and 345 of FIG. 3a.

The back plane implantation regions 369 and 368 of the P-channel transistor 360 and of the N-channel transistor 365 comprise a P-type implantation species as described with regard to the N-channel transistor 345 of the fully depleted SOI CMOS device 300. As the transistors 360, 365 exhibit the same back plane implantation type, the back plane implantation regions 369 and 368 are not separated by a PN junction so that the back plane implantation regions 369 and 368 have to be separated by appropriate isolation structures. Thus, the isolation structures 363 extend down to the deep implantation region 367 which separates the back plane implantation regions 369 and 368 from the bulk substrate 331. Thus, the deep implantation region 367 comprises an N-type implantation species to form PN junctions at the interface to the back plane implantation regions 369 and 368. Due to the avoidance of a direct PN junction between the back plane implantation region 369 of the P-channel transistor 360 and the back plane implantation region 368 of the N-channel transistor 365, the available back bias range of the P-channel transistor 360 may be significantly wider. The threshold voltage $V_t$ of the P-channel transistor 360 may be controlled independently from the N-channel transistor 365 so that the transistors 360, 365 of the CMOS device 350 may serve as a basis for an SRAM cell with wider back bias controllability compared to an SRAM cell based on the transistors 340, 345 of the CMOS device 300 (FIG. 3a).

Figure 4:
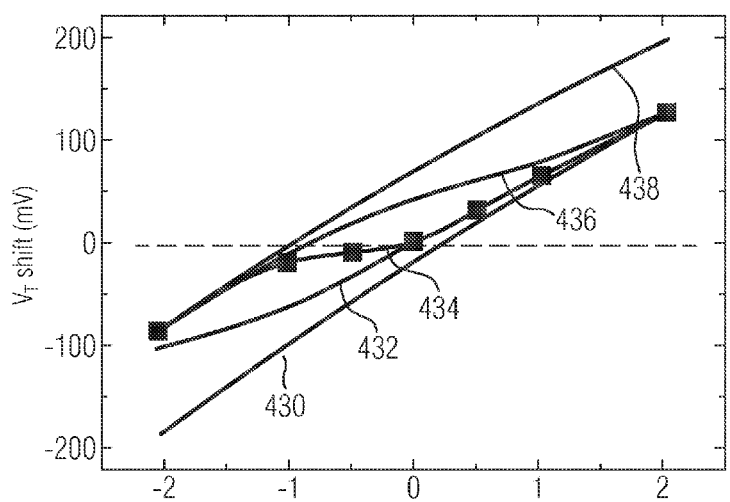
FIG. 4 depicts a diagram illustrating the threshold voltage shift of a fully depleted SOI PFET transistor versus an applied back plane bias voltage.

FIG. 4 depicts a diagram illustrating the dependence of a threshold voltage shift of a fully depleted SOI P-channel transistor, such as P-channel transistor 340 (FIG. 3a) and P-channel transistor 360 (FIG. 3b), from a back plane bias voltage and an implantation concentration in a back plane implantation region, such as back plane implantation regions 339 and 369. Curve 434 indicates the dependence of a threshold voltage shift of a P-channel transistor with an undoped back plane implantation region from a back plane bias voltage, wherein undoped means that the back plane implantation region comprises no additional implantation species but only the base implantation of the substrate, which is in the depicted case a P-type concentration of $10^{15}$ atoms per cm$^3$. The curve 436 represents a threshold voltage dependence from a back plane bias voltage for a P-channel transistor with a P-type back plane implantation having a concentration of $10^{17}$ atoms per cm$^3$ and curve 438 for a P-channel transistor with a P-type back plane implant concentration of $10^{20}$ atoms per cm$^3$. The curves 432 and 430 represent the threshold voltage shift of a P-channel transistor in dependence of a back plane bias voltage for a P-type back plane implant concentration of $10^{17}$ respectively $10^{20}$ atoms per cm$^3$. As can be seen from curves 430 and 438, a threshold voltage shift of about 300 mV may be achieved for a concentration of $10^{20}$ atoms per cm$^3$ independent of the implantation type. The curves 432 and 436 representing a lower implantation concentration and the curve 434 show that the threshold voltage shift of a P-channel transistor may be only 200 mV for a back plane bias voltage range from −2 V to 2 V.

Thus, a higher concentration of the back plane implantation species preferably provides a wider range of threshold voltage tuning. A threshold voltage shift of 0.05 V may be, for example, achieved by increasing the back plane bias voltage from 0 V to 0.8 V for a back plane implantation species concentration of $10^{20}$ atoms per cm$^3$. A change of the back plane bias voltage from 0 V to −1 V leads to a threshold voltage shift of about 0.02 V for a P-channel transistor with undoped back plane region. Thus, back plane implantation is appropriate to adjust the threshold voltage of the P-channel transistor in a certain range and to adjust the sensibility to a back plane bias voltage variation. Thus, fully depleted SOI transistors may exhibit a characteristic appropriate to form SRAM cells allowing for a desired tuning of the threshold voltage $V_t$ by rising the back gate bias voltage during a write operation to facilitate writing the SRAM cells which are selected for writing by the corresponding bitlines. It turned out, however, that unselected SRAM cells connected to an active wordline may be disturbed when the threshold voltage $V_t$ is raised by a high back gate bias voltage during a write operation of selected SRAM cells.

Figure 5A:
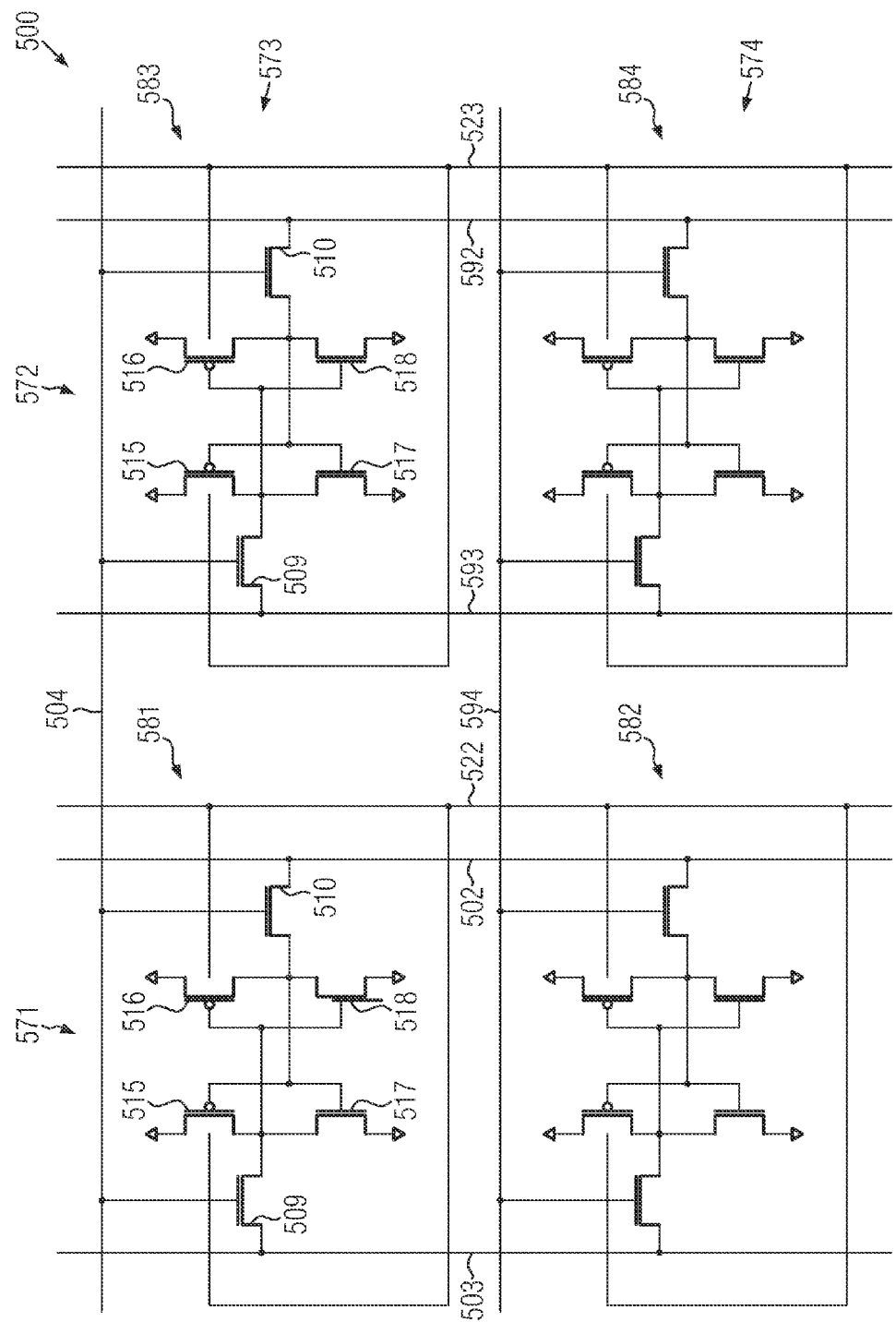
FIG. 5a schematically illustrates an SRAM device according to the present invention.

FIG. 5a depicts an SRAM device 500 comprising a plurality of SRAM cells arranged in rows and columns. With regard to the general function of an SRAM cell, we refer to the description provided with regard to FIG. 1. The SRAM device 500 comprises SRAM cells 581, 582, 583 and 584 comprising fully depleted SOI N-channel and P-channel transistors. The pass-gate transistors 509 and 510 and the pull-down transistors 517 and 518 represent fully depleted SOI N-channel transistors such as the transistors 345, 365 described with regard to FIGS. 3a and 3b. The pull-up transistors 515 and 516 represent corresponding P-channel transistors with controllable back gates. The back gates of the P-channel transistors 515 and 516 are connected to a back gate control line 522 which is further connected to SRAM cell 582 of column 571. A first back gate control signal is applied when the column 571 is selected for writing by the bitline 502 and inverse bitline 503. In case that, for example, the first row 573 of the SRAM device 500 is set into the write mode by applying a high voltage to the write line 504, the first back gate control signal is concurrently applied to the back gate control line 522 so that a threshold voltage $V_t$ of the pull-up transistors 515 and 516 of the SRAM cell 581 is increased during the write operation so that the write margin of the selected SRAM cell may be improved. During the write operation of SRAM cell 581, the SRAM cell 583, which is connected to the same wordline 504, is not selected by bitline 592 and inverse bitline 593 for writing. The SRAM cell 583 comprises back gate pull-up transistors connected to the back gate control signal line 523. A second back gate control signal is applied to the back gate control signal line 523 which represents a low voltage to avoid a threshold voltage increase in the unselected SRAM cell 583 during the write operation of SRAM cell 581. Thus, the stability of the SRAM cell 583 is not adversely affected by the write operation performed in the SRAM cell 581.

The wordline 594 is supplied with a low voltage during the write operation of SRAM cell 581 so that SRAM cells 582 and 584 are also not affected during the write operation. In one embodiment, the first back gate control signal voltage representing a high voltage level may be set to the VDD level, which may be in one embodiment in the range of 0.6 to 1 V. The low voltage level applied to the unselected column 572 during the write operation of SRAM 581 may be the VSS voltage level. During the read mode, the back gate control lines 522 and 523 of columns 571 and 572 are held on a low voltage level independently whether the columns 571 or 572 are selected or not. Thus, any read operation of the SRAM cells 581, 582, 583, 584 is not influenced by a threshold voltage shift so that the read operation is not adversely affected. In one embodiment, the low voltage level applied to the back gate control lines 522 and 523 during read operation is represented by the VSS voltage level.

Figure 5B:
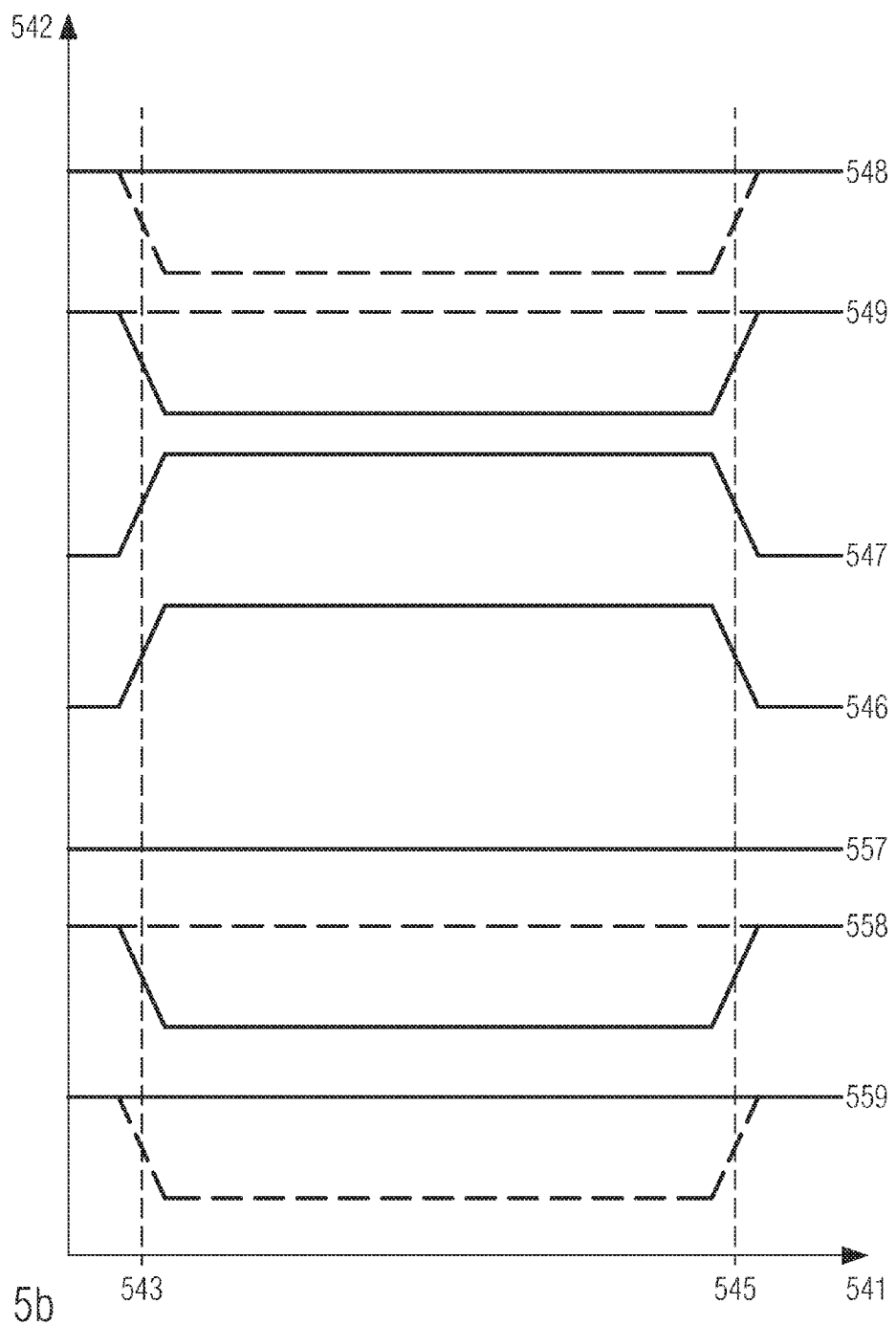
FIG. 5b schematically illustrates signals applied in a method of operating the SRAM device of FIG. 5a according to an embodiment of the present invention.

In the following, the operation of SRAM device 500 according to an embodiment will be described with reference to FIG. 5b. FIG. 5b is a graph illustrating signals which can be applied in the SRAM device 500 when data are written to SRAM cell 581. A first coordinate axis 541 denotes time, and a second coordinate axis 542 denotes a voltage of the signals. For simplicity, in FIG. 5b, curves showing the voltage of signals have been shifted in the vertical direction, so that there is no overlap between the curves. Each of the signals shown in FIG. 5b can have a voltage substantially equal to the low voltage provided by a power source or a voltage substantially equal to the high voltage provided by the power source, and optionally can be switched between the low voltage and the high voltage.

Accordingly, in FIG. 5b, a rising edge of a signal indicates a transition from the low voltage to the high voltage, and a falling edge indicates a transition from the high voltage to the low voltage.

FIG. 5b shows an illustrative embodiment wherein data are written to SRAM cell 581 in the row 573 and in the column 571 of the SRAM device 500.

During a time interval between a point of time 543 and a point of time 545, a data signal 548 is applied to bitline 502. The signals 548 correspond to data which are to be written to SRAM cell 581.

In FIG. 5b, a situation is shown wherein the state of SRAM cell 581 to be obtained in the write procedure is a state wherein the true output of the SRAM cell 581 that is electrically connected to bitline 502 is at the high voltage. Before the point of time 543 and after the point of time 545, bitline 502 can be at the high voltage. The voltages applied to bitline 502 in the time interval between the points of time 543, 545 correspond to the voltages of the true output of SRAM cell 581 to be obtained after the write procedure. Hence, in the example shown in FIG. 5b, data signal 548 remains at the high voltage during the time interval.

If the state of SRAM cell 581 to be obtained after writing data to SRAM cell 581 were a state wherein the true output of the SRAM cell 581 is at the low voltage, the bitline 502 would be switched to the low voltage during the time interval between point of time 543 and point of time 545 as indicated by the dashed line.

During the time interval from point of time 543 to point of time 545, an inverse data signal 549 can be applied to inverse bitline 503. Inverse data signal 549 is inverse to data signal 548, wherein inverse data signal 549 is low if data signal 548 is high, and inverse data signal 549 is high if data signal 548 is low. Before point of time 543 and after point of time 545, the inverse bitline 503 can be maintained at the high voltage.

At the point of time 543, a first back gate control signal 547 can be applied to the back gate control line 522 so that the back gate terminals of the P-channel field effect transistors 515, 516 of the SRAM bitcell 581 may be set at a high voltage so that the threshold voltage $V_t$ of the P-channel field effect transistors 515, 516 is increased to improve writeability of SRAM bitcell 581 during the write operation.

At the time interval between the point of time 543 and the point of time 545, a second back gate control signal 557 can be applied to the back gate control line 523 so that the back gate terminals of the P-channel field effect transistors of the SRAM bitcell 583 may be set at a low voltage so that the threshold voltage $V_t$ of the P-channel field effect transistors of the SRAM bitcell 583 is maintained at a lower level to maintain stability of SRAM bitcell 583 during writing data into SRAM bitcell 581.

A wordline signal 546 can be applied to the wordline 504 associated with the row 573 of the SRAM device 500 wherein the SRAM cells 581, 583 are provided. This can be done by switching the voltage of the wordline 504 from low to high. In some embodiments, the wordline signal 546 can be applied at the same point of time 543 at which the write data are applied to the bitline 502 and the inverse bitline 503. In other embodiments, the wordline signal 546 can be applied after time point 543 so that the write data and the back gate signals 547, 557 are already stabilized at the time point of applying the wordline signal 546.

By applying the wordline signal 546 to wordline 504, the pass-gate transistors 509, 510 of SRAM cells 581, 583 are switched into the electrically conductive on-state, so that the voltage applied to the respective bitlines electrically connected to each SRAM cell of row 571 is applied to the inverters represented by the transistors 515, 516, 517, 518 of the SRAM cell 581.

Hence, compared to the device described above with reference to FIG. 1, the writeability of the SRAM device 500 can be improved. In contrast to proposals according to the state of the art, wherein a global back gate bias voltage is applied to the bitcells of the entire SRAM device, an improved writeability in selected cells can be obtained in embodiments of the present disclosure, wherein the cell stability of unselected cells may be maintained so that the bitline 592 and the inverse bitline 593 reliably represent the data stored in the unselected SRAM bitcell 583, indicated in FIG. 5b by the cell data signals 558, 559.

In some embodiments, each of the SRAM cells 581, 582, 583, 584 is a six transistor SRAM cell. However, the structure of the SRAM cells is not limited to the six-transistor configuration. In other embodiments, different configurations of SRAM cells which can optionally comprise more than six transistors may be employed. In some embodiments, each SRAM bitcell is a multiport bitcell, such as a two port, a dual port or other configuration.

At the point of time 545, the first back gate control signal 547 is no longer applied to the back gate control line 522 so that the back gate terminals of the P-channel field effect transistors 515, 516 of the SRAM bitcell 581 may be set at a low voltage so that the threshold voltage $V_t$ of the P-channel field effect transistors 515, 516 is reduced after the write operation so that subsequent read operations or write operations in other rows are not adversely affected.

Additionally, the wordline signal 546 is no longer applied to wordline 504, so that the pass-gate transistors 509, 510 of the SRAM cells 581, 583 electrically disconnect the inputs and outputs of the inverters of the SRAM cells 581, 583 from the bitlines 502, 592 and the inverse bitlines 503, 593. Thus, the SRAM cell 581 is switched into the stand-by mode, wherein the SRAM cell 581 maintains the state into which it was set during the write procedure.

Figure 5C:
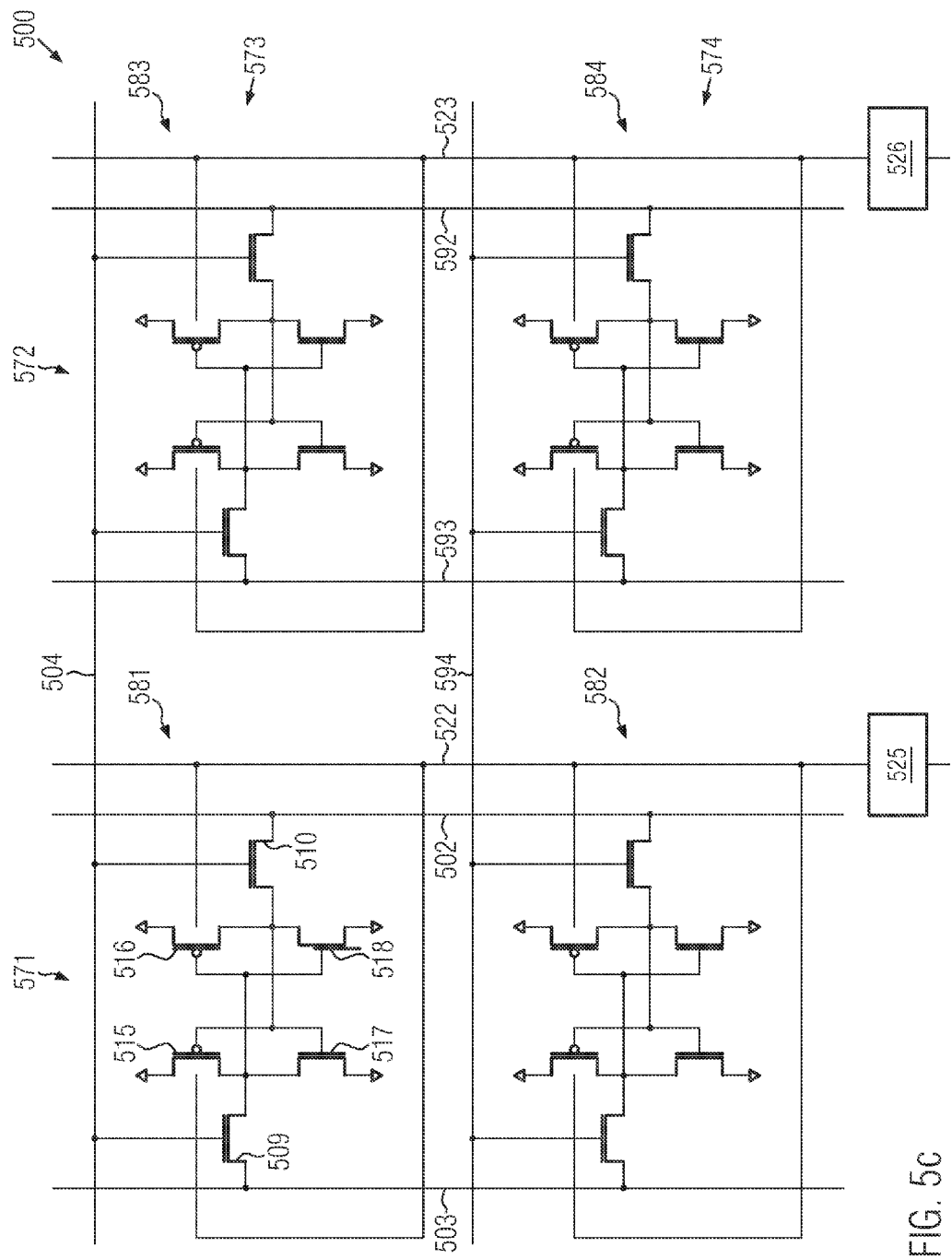
FIG. 5c schematically illustrates an SRAM device according to the present invention.

FIG. 5c depicts an SRAM device 500 comprising the SRAM cells 581, 582, 583 and 584, wherein the back gate control lines 522 and 523 are connected to voltage adjusting circuits 525 and 526. Thus, the bias voltage range applied to the back gate control lines 522 and 523 may be adjusted independently from the supply voltage level (VDD). As can be seen from FIG. 4, a back plane bias voltage variation of 2 V may result in a threshold voltage $V_t$ increase of about 150 mV. To achieve a corresponding high threshold voltage shift, the required back plane bias voltage variation is higher than a voltage variation achieved by switching the voltage of the back gate control lines from VSS to VDD. Thus, using a voltage adjusting circuit 525 comprising a voltage rising circuit may further improve writeability and consequently improve stability of the SRAM cell. The voltage adjusting circuit may comprise, for example, a charge pump, which is a kind of DC to DC converter, that is appropriate, for example, to double voltages, triple voltages or half voltages so that the level of the back gate control signal may be optimized with regard to the desired threshold voltage shift.

FIG. 6a depicts an SRAM device 600 comprising an SRAM array 601 comprising SRAM cells arranged in arrays of m rows and n columns. Each of the m rows is connected to a wordline 604 and each of the n columns is connected to a pair of bitlines 602 and inverse bitlines 603. Thus, the bitlines 602 and 603 represent n pairs of separate bitlines and the wordlines 604 represent m separate wordlines. The bitlines 602 and 603 are connected to a bitline control circuit 627 which generates bitline control signals appropriate to write a bit of a word supplied by data input line 628 into the SRAM array 601 during a write operation. During read operation, a bit of a word obtained from the SRAM array 601 is sensed in the bitline control circuit 627 and provided to the data output line 629. The back gate control line 622 may be connected to an inverter 645 which provides a required first or second back gate control signal as described with regard to FIG. 5a. The back gate control line 622 represents n separate back gate control lines each connected to one of n inverters represented by inverter 645. The SRAM device 600 comprises one inverter 645 per bitline pair. Each inverter 645 provides a back gate control signal on the basis of a "write assist not" signal provided to the inverter 645 via the write control line 624 which represents n separate control lines. As described with regard to FIG. 5a, a high level back bias shift signal is provided only to selected bitcell columns during write operation, whereas the unselected bitcell columns are supplied with a low level back bias control signal so that the threshold voltage $V_t$ is not shifted. In one embodiment, only one write control line 624 is set to a low level in the write mode, whereas the other write control lines 624 are set to a high level so that only the threshold voltage $V_t$ of the back gate pull-up transistors of a single column is raised. In the other modes, such as standby mode or write mode, all write control lines 624 are set to a high voltage level.

In the depicted embodiment, the inverters 645 are implemented separate from bitline periphery circuits so that the back bias functionality may be feasible without modifying the conventional bitline control circuits. In one embodiment, a voltage adjusting circuit (not shown) may be arranged between the inverter 645 and the back gate control line 622 to provide for a wider back gate bias voltage range as described with regard to FIG. 5c.

FIG. 6b depicts a further SRAM device 650 comprising p SRAM arrays 601 each comprising a plurality of SRAM cells arranged in m rows and n columns, wherein p is the number of bits of a word to be stored in the SRAM device 650. Each SRAM array 601 is connected to m wordlines 604, n bitlines 602 and n inverse bitlines 603. Each of the n pairs of bitlines 602 and inverse bitlines 603 is connected to a multiplexer 655 so that n multiplexers 655 are connected to one SRAM array 601 and n×p multiplexers 655 are arranged in the entire SRAM device 650 for controlling the bitlines 602, 603. Each multiplexer 655 comprises two P-channel transistors 641, 642 and two N-channel transistors 643, 644. One P-channel transistor 641, 642 and one N-channel transistor 643, 644 are connected in parallel, respectively. Each parallel circuit is connected to a bitline 602 and a true bitline 648 or an inverse bitline 603 and a complement bitline 649. The transistors 641 and 643 may thus connect one bitline 602 with one true bitline 648, whereas the transistors 642, 644 are arranged to allow for connecting one inverse bitline 603 with one complement bitline 649. The gate electrodes of the P-channel transistors 641, 642 may be connected with a select line 646 of a select bus which comprises n separate select lines. Thus, a single select signal applied to the select line 646 may be applied to the P-channel transistors 641 and 642 concurrently so that during a read control signal applied to select line 646, the voltage signal provided by the selected bitcell may be provided to the true bitline 648 and the complement bitline 649 and hence to a sense amplifier (not shown) connected to the true bitline 648 and the complement bitline 649.

During a write operation, a write control signal may be applied via a write control line 647 of a write control bus comprising n write control lines to an input terminal of inverter 645. The output terminal of the inverter 645 may be connected to the gate electrodes of the N-channel transistors 643 and 644 and a back gate control line 622. The write control signal applied to write control line 647 may be thus exploited to connect a write driver circuit (not shown) via the true bitline 648 to the bitline 602 and via complement bitline 649 to the inverse bitline 603. Concurrently, the inverter 645 may provide a high voltage to the back gate control line 622 to increase the threshold voltage of the pull-up transistors of selected bitcells arranged in the SRAM array 601. In one embodiment, the write operation may be assisted by applying a select signal to the select line 646 during write operation so that the P-channel transistor 641 and 642 may be in the on-state also during the write operation. Consequently, the transistors 641 and 643 and the transistors 642 and 644 which are connected in parallel, respectively, may be in the on-state so that the conductivity of the parallel circuits may be further reduced so that the stability of the write operation is further improved.

In the depicted embodiment, the inverters 645 are implemented in the bitline control circuit so that the inverters 645 may be utilized to control the multiplexer 655 as well as the back gate bias voltage so that the back bias technique may be implemented more efficiently.

In some embodiments, each of the SRAM bitcells is a six transistor SRAM cell. However, the structure of the SRAM cells is not limited to the six-transistor configuration. In other embodiments, different configurations of SRAM cells which can optionally comprise more than six transistors may be employed. In some embodiments, each SRAM bitcell is a multiport bitcell, such as a two port, a dual port or other configuration.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A device, comprising:
   a plurality of static random-access memory (SRAM) bitcells arranged in rows and columns, wherein said SRAM bitcells comprise fully depleted silicon-on-insulator field effect transistors (FDSOI-FETs), said FDSOI-FETs comprise P channel-pull-up-transistors, wherein each P-channel-pull-up-transistor comprises a back gate;
   a plurality of bitlines, each bitline being electrically connected to said SRAM bitcells of one of said columns;
   a plurality of wordlines, each wordline being electrically connected to said SRAM bitcells of one of said rows; and
   a bitline control circuit configured to select at least one column for writing, wherein, during a write operation, a first control signal is applied to said back gates of said P-channel-pull-up-transistors of said at least one column selected for writing and a second control signal is concurrently applied to said back gates of said P-channel-pull-up-transistors of said columns not selected for writing, and wherein, during a standby mode, a back gate control signal applied to said back gates of said P-channel-pull-up-transistors of said plurality of SRAM bitcells comprises the same voltage level.

2. The device of claim 1, wherein said first control signal is a high voltage signal and said second control signal is a low voltage signal.

3. The device of claim 2, further comprising a high voltage power supply line and a low voltage power supply line, wherein said high voltage signal corresponds to a high voltage power supply level and said low voltage signal corresponds to a low voltage power supply level.

4. The device of claim 2, wherein said high voltage signal corresponds to a VDD level and said low voltage signal corresponds to a VSS level of the supply voltage.

5. The device of claim 1, wherein said back gates of said P-channel-pull-up-transistors comprise a back gate implantation region.

6. The device of claim 1, wherein said FDSOI-FETs further comprise N-channel transistors representing N-channel-pull-down-transistors and N-channel-pass-gate-transistors.

7. The device of claim 6, wherein said P-channel transistors and said N-channel transistors comprise back gate implant regions with a different conductivity type.

8. The device of claim 6, further comprising a deep trench isolation structure separating said P-channel transistors and said N-channel transistors.

9. The device of claim 1, wherein said first control signal is applied to said back gates of said at least one column selected for writing substantially simultaneously with a write select signal selecting said at least one column for writing.

10. The device of claim 9, wherein said bitline control circuit comprises a multiplexer utilized to select said at least one column for writing, wherein a single inverter is employed to provide said write select signal and said first back gate control signal.

11. A method, comprising:
provide a plurality of static random-access memory (SRAM) bitcells arranged in rows and columns, wherein said SRAM bitcells comprise fully depleted silicon-on-insulator field effect transistors (FDSOI-FETs), said FDSOI-FETs comprise P-channel-pull-up-transistors, wherein each P-channel-pull-up-transistor comprises a back gate;
writing data to at least one of said plurality of SRAM bitcells by applying a wordline signal to a wordline electrically connected to said SRAM bitcells of one row, applying a data signal to at least one bitline electrically connected to said SRAM bitcells of at least one column selected for writing, and applying a first control signal to said back gates of said P-channel-pull-up-transistors of at least one column selected for writing and a second control signal to said back gates of said P-channel-pull-up-transistors of said columns not selected for writing; and
holding said at least one of said plurality of SRAM bitcells in a standby mode, wherein a back gate control signal applied to said back gates of said P-channel-pull-up-transistors of said plurality of SRAM bitcells comprises the same voltage level.

12. The method of claim 11, wherein said first control signal is a high voltage signal and said second control signal is a low voltage signal.

13. The method of claim 12, wherein said high voltage signal corresponds to a high voltage power supply level and said low voltage signal corresponds to a low voltage power supply level.

14. The method of claim 11, wherein said first control signal is applied to said back gates of said at least one column selected for writing substantially simultaneously with a write select signal selecting said at least one column for writing.

15. The method of claim 11, further comprising reading data from said at least one of said plurality of SRAM bitcells, wherein a back gate control signal applied to said back gates of said P-channel-pull-up-transistors of said plurality of SRAM bitcells comprises the same voltage level.

16. The method of claim 15, wherein said back gate control signal applied to said back gates of said P-channel-pull-up-transistors of said plurality of SRAM bitcells during reading comprises a low voltage level.

17. The method of claim 11, wherein said back gate control signal applied to said back gates of said P-channel-pull-up-transistors of said plurality of SRAM bitcells comprises a low voltage level.

18. The method of claim 11, wherein said FDSOI-FETs further comprise N channel transistors representing N-channel-pull-down-transistors and N-channel-pass-gate-transistors.

19. The method of claim 18, wherein each SRAM bitcell is a six transistor SRAM bitcell.

20. The method of claim 18, wherein each SRAM bitcell is a multiport bitcell.

21. The method of claim 20, wherein said multiport bitcell has one of a two port and a dual port configuration.

* * * * *